United States Patent
Miki

[11] Patent Number: 6,121,821
[45] Date of Patent: Sep. 19, 2000

[54] BOOSTER CIRCUIT FOR SEMICONDUCTOR DEVICE

[75] Inventor: Atsunori Miki, Tokyo, Japan

[73] Assignee: NEC Corporation, Tokyo, Japan

[21] Appl. No.: 09/280,972

[22] Filed: Mar. 30, 1999

[30] Foreign Application Priority Data

Mar. 31, 1998 [JP] Japan .................................. 10-086615

[51] Int. Cl.[7] ............................................... H01L 25/00
[52] U.S. Cl. ............................................ 327/536; 327/566
[58] Field of Search ................................... 327/534, 535, 327/536, 537, 566

[56] References Cited

U.S. PATENT DOCUMENTS 5,856,918  1/1999  Soneda et al. .......................... 327/536

FOREIGN PATENT DOCUMENTS 5-325578  12/1993  Japan .
7-111095   4/1995  Japan .
8-103070   4/1996  Japan .
9-266281  10/1997  Japan .
9-331671  12/1997  Japan .

*Primary Examiner*—Jeffrey Zweizig

*Attorney, Agent, or Firm*—Sughrue, Mion, Zinn, Macpeak & Seas, PLLC

[57] ABSTRACT

A booster circuit is disclosed, the booster circuit having a plurality of booster cells tandem-connected, each of the boosters having a transfer transistor and a capacitor, an input terminal, a drain, and a gate of the transfer transistor being connected, a source of the transfer transistor being an output terminal, a first terminal of the capacitor being connected to the source of the transfer transistor, a clock signal being supplied to a second terminal of the capacitor, wherein the transfer transistor is composed of a triple-well having a first well and a second well, the first well being formed on a semiconductor substrate, the second well being formed on the first well, and wherein the semiconductor substrate is connected to a reference voltage, a diffusion layer in the first well, a first diffusion layer in the second well, a second diffusion layer in the second well, the first terminal of the capacitor, and the gate of the transfer transistor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well.

15 Claims, 13 Drawing Sheets

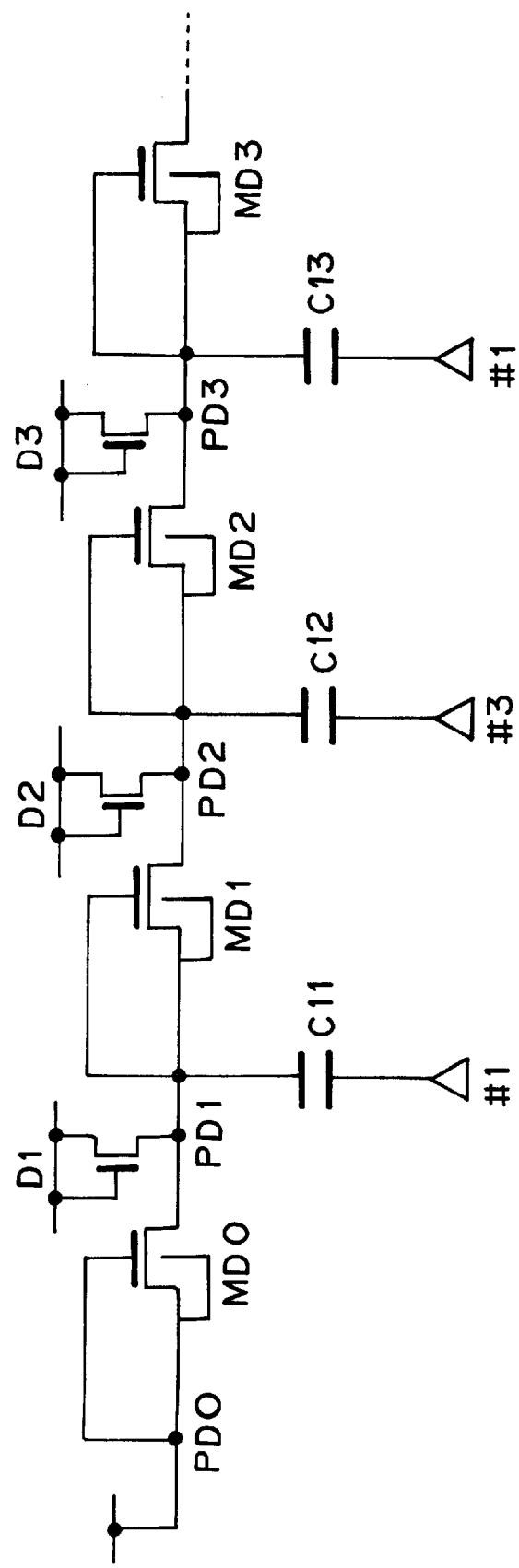
F I G. 1

BOOSTER CIRCUIT FOR SEMICONDUCTOR DEVICE

BACKGROUND OF THE INVENTION

1. Field of the Invention

The present invention relates to a booster circuit for boosting a voltage supplied from a power supply, in particular, to a booster circuit for generating a plurality of power supply voltages, the booster circuit being disposed in for example a semiconductor non-volatile storage device.

2. Description of the Related Art

Conventionally, in a semiconductor non-volatile storage device, for example, an electrically erasable and programmable read only memory (EEPROM), when a signal is written thereto or erased thereto and therefrom, a booster circuit having a plurality of booster cells connected in series is used for needing the higher voltage than the power supplying voltage.

Such a booster circuit is described in Japanese Patent Laid-Open Publication No. 7-111095. In the related art reference, as shown in FIG. 16, a booster circuit is composed of N type transistors formed on a P type substrate. The booster circuit shown in FIG. 1 is a two-phase clock type booster circuit. In reality, the booster circuit comprises capacitors Cp (QQ1 to QQ3) and transfer transistors M (M0 to M3). A clock signal #1 and an inverted clock signal #3 thereof are supplied to first terminals of the capacitors QQ1 to QQ3 so as to drive the transfer transistors M0 to M3. The transfer transistors M0, M1, M2, M3, . . . and Mn are connected in series. An anode of each booster capacitor Cp is connected to a diffusion layer between the transistors M0, M1, M2, M3, . . . and Mn. A clock signal is supplied to a cathode of each booster capacitor.

Further, A clock signal is supplied as a combination of two phases of the clock signal #1 and the clock signal #3 as shown in FIG. 17. The transfer transistors M0, M1, . . . , and Mn are MOS transistors. In each of the transfer transistors M0, M1, . . . , and Mn, a drain and a gate are connected. The source of each MOS transistor D1, D2, D3, . . . and Dn whose drain and gate are connected to a power supply VDD is connected to each of the anode connecting point P1, P2, . . . , and Pn of the booster capacitors Cp.

In the booster circuit, corresponding to clock signals #1 and #3, a voltage of a booster cell in the current stage is added to a voltage of a booster cell in the preceding stage. With a booster cell in the n-th stage, a desired voltage can be obtained. Thus, to obtain a desired boosted voltage, a plurality of booster cells and a plurality of clocks are required. Thus, the boosting time becomes long.

As another related art reference, a non-volatile semiconductor storage device is disclosed in Japanese Patent Laid-Open Publication No. 5-325578. The related art reference is a booster circuit shown in FIG. 5. The booster circuit is driven with four-phase clock signals #1 to #4 generated by a ring-oscillator. The booster circuit comprises D type n-channel MOS transistors QD1 to QD3 and E type n-channel MOS transistors MJ0 to MJ3. The D type n-channel MOS transistors QD1 to QD3 are used as capacitors. The E type n-channel MOS transistors MJ0 to MJ3 are used as transfer gates. The booster circuit further comprises D type n-channel MOS transistors QD5 to QD8 and E type n-channel MOS transistors NJ0 to NJ3 so as to prevent the gate voltages of the transfer gates MJ0 to MJ3 from dropping due to voltages corresponding to threshold values. The D type n-channel MOS transistors QD5 to QD8 are used as capacitors. The E type n-channel MOS transistors NJ0 to NJ3 are used as transfer gates.

When the clock signal #1 is "H" (in FIG. 5, ▽ represents a terminal), electricity at a power supply voltage Vcc are charged to the capacitor QD1 and QD3. In addition, when the clock signal #1 is "H", part of electricity charged in the capacitors QD1 and QD3 are transferred and charged to the capacitors QD6 and QD8 through the transfer gates NJ1 and NJ3, respectively. Thus, the gate voltages of the transfer gates MJ1 and MJ3 rise. In this state, when the clock signal #3 becomes "L" and the clock signal #2 becomes "H", electricity charged in the capacitors QD1 and QD3 are transferred and charged to the capacitors QD2 and QD4 through the transfer gates MJ1 and MJ3, respectively. Such operations are repeated and thereby a boosted voltage Vpp of which the power supply voltage Vcc is boosted is obtained.

Predetermined voltages (Vcc−VTD) (where VDT represents threshold values of MOSD1 to MOSD3) are pre-applied to the individual nodes. Thus, at the beginning of the boosting operation, it is not necessary to charge the booster circuit until the voltage becomes (Vcc−VTD). As the power supply voltage Vcc drops, the boosting capability of the booster circuit tends to lower. However, when the frequencies of the drive signals #1 to #4 become high, such a tendency can be canceled. The booster circuit causes the final output voltages Vout of the transfer transistors to be boosted from the power supply voltage Vcc to a high voltage Vpp.

The transfer transistors shown in FIG. 16 are n-type MOS transistors formed on a p type substrate as shown in FIG. 18. An output PDn of a booster cell in a preceding stage is connected to a drain diffusion layer N+. In addition, a capacitor QQ1 (QQ3/QQ2) is connected to a gate of the n-type MOS transistor. An output PDn+1 is supplied from a source of the n-type MOS transistor to a transfer transistor in the next stage.

As another related art reference, a booster circuit shown in FIG. 19 is known. In the booster circuit shown in FIG. 19, a plurality of charge pumps are disposed in parallel and output terminals thereof are connected in common so as to improve the boosting speed and the current supply capability of the booster circuit. Since the charge pumps are connected in parallel and the output voltage Vout is obtained, the output current can be doubled and thereby the current supplying capability can be improved.

A switch is disposed between an output of one charge pump and an input/output of another charge pump so as to vary the number of transfer transistors connected in series and in parallel corresponding to a signal voltage. The booster circuit disclosed in Japanese Patent Laid-Open Publication No. 7-111095 comprises a plurality of booster cells and a connection switch circuit. The booster cells boost input voltages and supply boosted voltages. The connection switch circuit selects a connection state of the booster cells. The connection switch circuit varies the number of booster cells connected in series and the number of booster cells connected in parallel.

However, in the conventional booster circuits, as the boosted voltage becomes high, the influence of back-gate bias characteristics becomes large. Thus, the boosting efficiency deteriorates.

On the other hand, when the boosting speed is increased, the layout area becomes large.

Next, such problems of the conventional booster circuits will be described. In the related art reference shown in FIG.

16, threshold values of transfer transistors M0, M1, M2, M3, . . . , Mn are denoted by VTM0, VTM1, VTM2, TM3, . . . , and VTMn. Voltages (Vcc−VTD) of which the power supply voltage Vcc is dropped for threshold values VTD of the MOS transistors (D1 to Dn+1) whose drain and gate are connected are applied to the nodes P of the transfer transistors M. A voltage applied to each node corresponding to the clock signal clk supplied to each capacitor Cp is denoted by Vclk.

In the boosting operation, the maximum voltage (Vcc−VTD+Vclk) is applied to the node P1. The maximum voltage (Vcc−VTD+Vclk−VTM1+Vclk) is applied to the node P2. The maximum voltage (Vcc−VTD+Vclk−VTM1+Vclk−VTM2+Vclk) is applied to the node P3. The source voltage Vout of the final transfer transistor Mn is boosted to the maximum voltage (Vcc−VTD+Vclk×n−(VTM1+VTM2+VTM3+ . . . +VTMn).

The maximum value vclk of the voltage amplitude applied to the drain of the transfer transistor M corresponding to a clock signal through a capacitor QD is expressed as follows.

$$Vclk=(Cp/(Cp+Cj))\times Vcc$$

(where Cj is the capacitor between a diffusion layer of a transistor and a semiconductor substrate)

However, after the booster circuit operates, the voltages at the nodes P1, P2, P3, . . . and Pn rise. Thus, there is a potential between the source of each transfer transistor M and the semiconductor substrate. Due to the back-gate characteristics, the threshold value of the transfer transistor M is proportional to the voltage thereof. Consequently, the threshold value VTMn of the final transmission transistor Mn is expressed as follows.

$$VTMn \approx Vclk$$

In other words, the boosted voltage has an upper limit. In addition, on the final output side, the current supplying capability and thereby the boosting efficiency deteriorate. In other words, the boosting speed deteriorates. FIG. 17 shows waveforms of the clock signals #1 and #3 of the booster circuit shown in FIG. 16 and a waveform of an output voltage Vout driven with the clock signals #1 and #3.

FIG. 20 shows the current supplying capability of the boosting circuit. In FIG. 20, the horizontal axis represents an output voltage Vout of the booster circuit and the vertical axis represents an output current Iout of the booster circuit. In FIG. 20, the number of stages represents the number of stages of booster cells. In this case, the number of stages represents the number of boosting capacitors Cp. As is clear from FIG. 20, as the number of stages becomes large, the current supplying capability of the booster circuit deteriorates and the boosted voltage is limited Next, the case of which the boosting speed is increased will be described.

To increase the boosting speed, the current supplying capability should be improved. To do that, it is necessary to increase the number of charge pumps connected in parallel. In FIG. 21, the horizontal axis represents an output voltage Vout of the booster circuit and the vertical axis represents a current Iout obtained from the booster circuit. FIG. 21 shows characteristics for one charge pump and two charge pumps connected in parallel. Thus, to increase the charging speed, the layout area becomes large. This tendency is reversely proportional to the current supplying capability of the booster circuit.

In the booster circuit disclosed in Japanese Patent Laid-Open Publication No. 7-111095, a switch is disposed between an output of part of charge pumps and input/output of another output circuit. When the number of transfer transistors connected in series and the number of charge pumps connected in parallel are varied, a circuit that controls the switch becomes complicated. In addition, the layout area becomes large.

In Japanese Patent Laid-Open Publication Nos. 8-103070, 9-266281, and 9-331671, booster circuits are disclosed. However, in those related art references, the back-gate bias characteristics are not considered.

SUMMARY OF THE INVENTION

An object of the present invention is to improve the current supplying capability of a booster circuit, raise the boosting efficiency, and properly increase the boosting speed.

A first aspect of the present invention is a booster circuit having a plurality of booster cells tandem-connected, each of the boosters having a transfer transistor and a capacitor, an input terminal, a drain, and a gate of the transfer transistor being connected, a source of the transfer transistor being an output terminal, a first terminal of the capacitor being connected to the source of the transfer transistor, a clock signal being supplied to a second terminal of the capacitor, wherein the transfer transistor is composed of a triple-well having a first well and a second well, the first well being formed on a semiconductor substrate, the second well being formed on the first well, and wherein the semiconductor substrate is connected to a reference voltage, a diffusion layer in the first well, a first diffusion layer in the second well, a second diffusion layer in the second well, the first terminal of the capacitor, and the gate of the transfer transistor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well.

A second aspect of the present invention is a booster circuit having a plurality of booster cells tandem-connected, each of the boosters having a transfer transistor and a capacitor, an input terminal, a drain, and a gate of the transfer transistor being connected, a source of the transfer transistor being an output terminal, a first terminal of the capacitor being connected to the source of the transfer transistor, a clock signal being supplied to a second terminal of the capacitor, wherein clock signals with different phases by 180° are alternately supplied to the booster cells, wherein the transfer transistor is composed of a triple-well having a first well and a second well, the first well being formed on a semiconductor substrate, the second well being formed on the first well, and wherein the semiconductor substrate is connected to a reference voltage, a diffusion layer in the first well, a first diffusion layer in the second well, a second diffusion layer in the second well, the first terminal of the capacitor, and the gate of the transfer transistor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well.

A third aspect of the present invention is a booster circuit having a plurality of booster cells tandem-connected, each of the booster cells having a transfer transistor, a sub-transfer transistor, a first capacitor, and a second capacitor, an input terminal and a drain of the transfer transistor being connected, a source of the transfer transistor being an output terminal, the input terminal and a drain of the sub-transfer transistor being connection, a source of the sub-transfer transistor being connected to a gate of the transfer transistor and a first terminal of the second capacitor, a gate of the sub-transfer transistor being connected to a source of the transfer transistor, a first terminal of the first capacitor being connected to the source of the transfer transistor, a first clock signal being supplied to a second terminal of the first capacitor, a fourth clock signal being supplied to a second terminal of the second capacitor, wherein the transfer transistor is composed of a triple-well having a first well and a second well, the first well being formed on a semiconductor substrate, the second well being formed on the first well, and wherein the semiconductor substrate is connected to a reference voltage, a diffusion layer in the first well, a first diffusion layer in the second well, a second diffusion layer in the second well, and the first terminal of the capacitor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well.

A fourth aspect of the present invention is a booster circuit having at least two charge pumps, each of the charge pumps having a plurality of booster cells tandem-connected, each of the boosters having a transfer transistor and a capacitor, an input terminal, a drain, and a gate of the transfer transistor being connected, a source of the transfer transistor being an output terminal, a first terminal of the capacitor being connected to the source of the transfer transistor, a clock signal being supplied to a second terminal of the capacitor, wherein the transfer transistor is composed of a triple-well having a first well and a second well, the first well being formed on a semiconductor substrate, the second well being formed on the first well, wherein the semiconductor substrate is connected to a reference voltage, a diffusion layer in the first well, a first diffusion layer in the second well, a second diffusion layer in the second well, the first terminal of the capacitor, and the gate of the transfer transistor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well, and wherein a transistor is disposed between a first charge pump and a second charge pump, a drain of the semiconductor being connected to an output terminal of the first charge pump, a source of the transistor being connected to an input terminal of the second charge pump, a gate of the transistor being connected to the first charge pump, an output terminal of the first charge pump being connected to an output terminal of the second charge pump.

A fifth aspect of the present invention is a booster circuit having at least three charge pumps, each of the charge pumps having at least one booster cell for boosting a voltage, wherein a transistor is disposed in such a manner that an output terminal of a first charge pump is connected to a drain of the transistor, an input terminal of a second charge pump is connected to a source of the transistor, an output terminal of a third charge pump is connected to a gate of the transistor, and the output terminal of the first charge pump is connected to an output terminal of the second charge pump.

According to the present invention, the potential between the voltage applied to a back gate of a transfer transistor that is being charged and a source thereof is at most a threshold voltage (for example, 0.6 V) of a pn type diode. Thus, the influence of back-gate bias characteristics is alleviated in comparison with the related art references.

At the beginning of the boosting operation of the booster circuit, since the output voltage is low, the number of transfer transistors connected in series is small. Instead, the number of transfer transistors connected in series is large. Thus, the boosting speed increases. At the last of the boosting operation of the booster circuit, since the output voltage becomes high, the number of transfer transistors connected in series becomes small. Thus, a desired high voltage can be obtained.

In addition, since a circuit that controls the switch is not required, the layout area does not largely increase.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 1 is a circuit diagram according to a first embodiment of the present invention;

DESCRIPTION OF PREFERRED EMBODIMENTS

Next, with reference to the accompanying drawings, embodiments of the present invention will be described.

Figure 2:
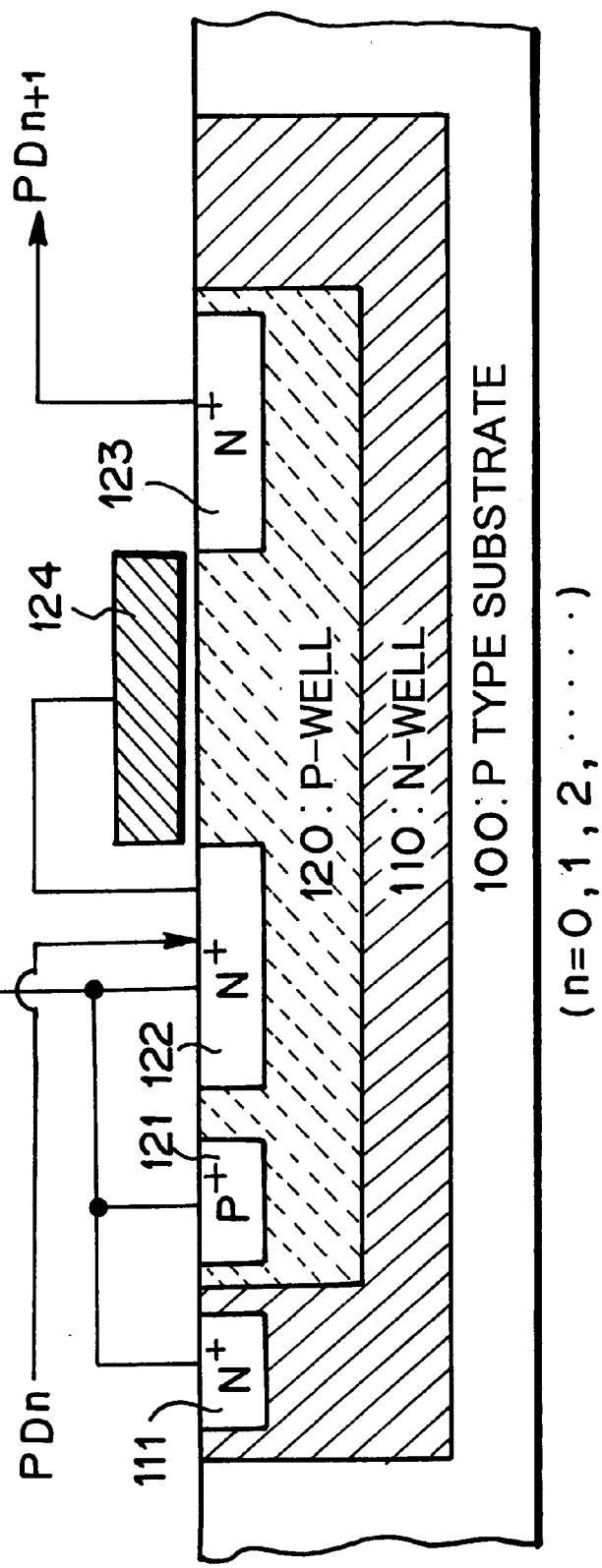
FIG. 2 is a sectional view showing a semiconductor substrate according to the first embodiment of the present invention.

A feature of the present invention is in that a transfer transistor is formed on a triple-well. A sub-transfer transistor is connected to a drain of each transfer transistor (on the opposite side of the final output). FIG. 2 is a sectional view showing the structure of a transistor formed on a triple-well. An N type well region is formed on a P type semiconductor substrate. A P type well is formed on the N type well. An N type MOS transistor is formed on a P type well. When a drain of the transistor, the P-type well, and the N-type well are connected in common, an N type transistor of which the sub-transfer transistor is connected to the drain of the transfer transistor can be formed. The N type well is separated for each transfer transistor with for example LOCOS.

First Embodiment

Figure 18:
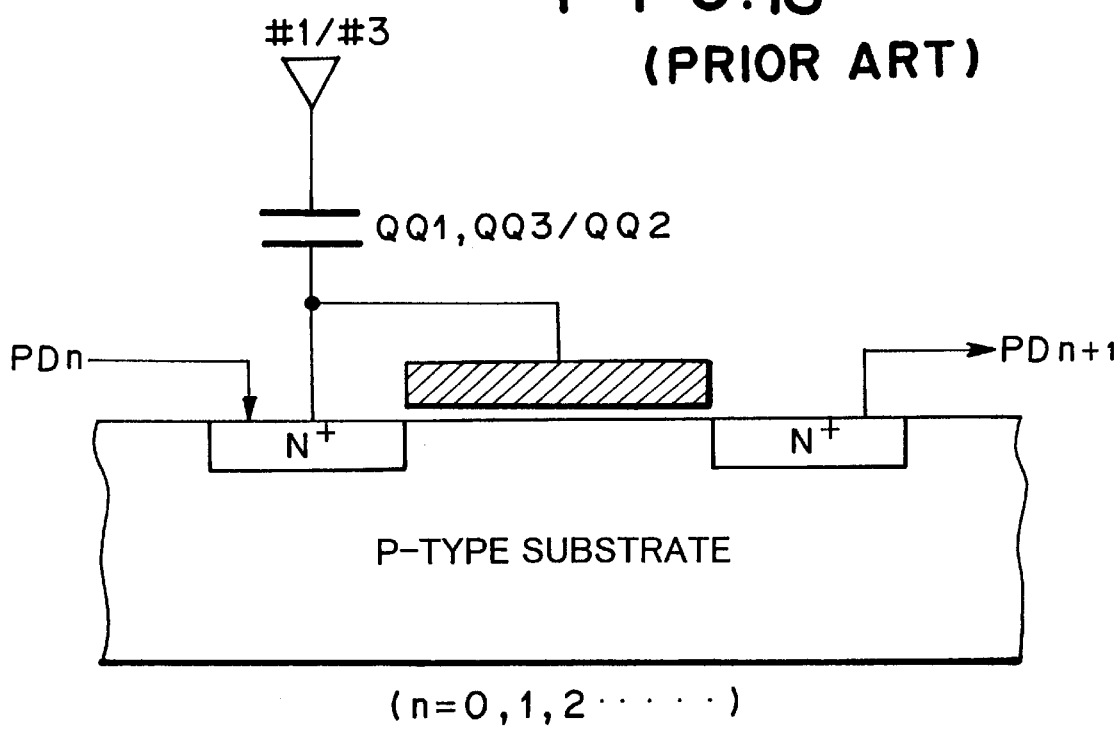
FIG. 18 is a sectional view showing a semiconductor substrate according to a related art reference.
Figure 19:
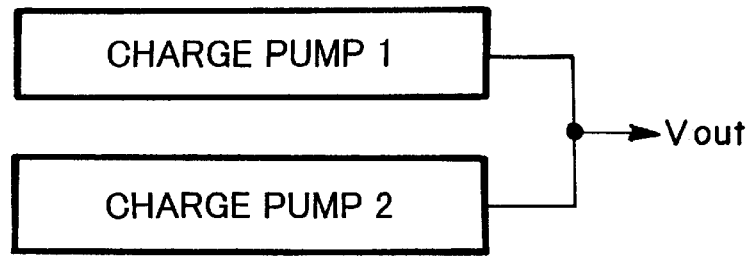
FIG. 19 is a conceptual block diagram according to a related art reference.
Figure 20:
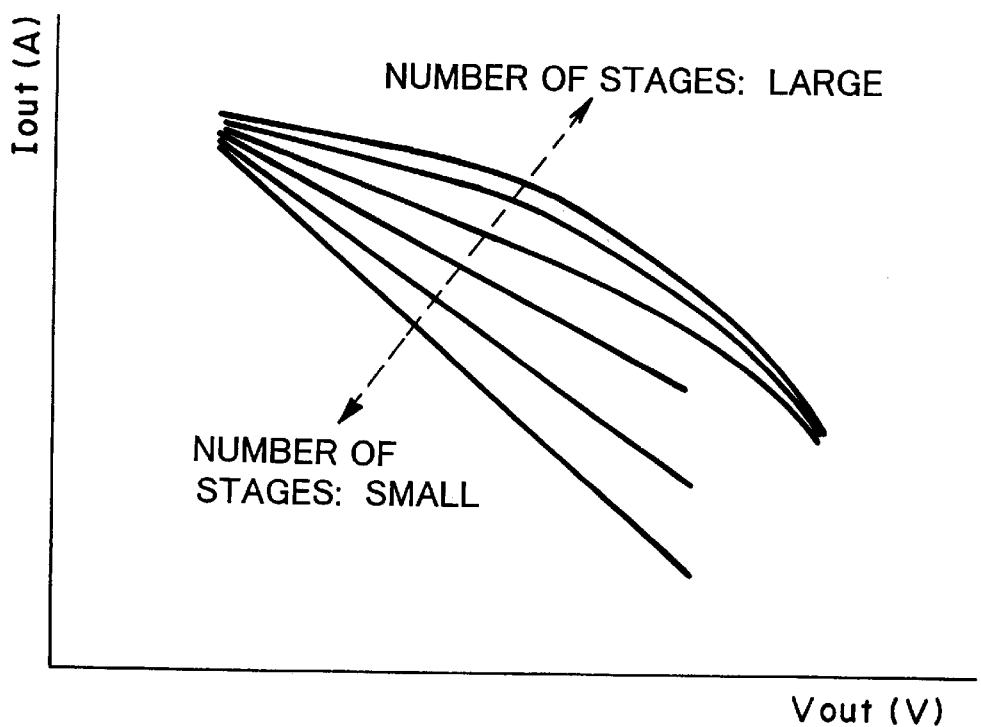
FIG. 20 is a graph showing characteristics according to a related art reference.
Figure 21:
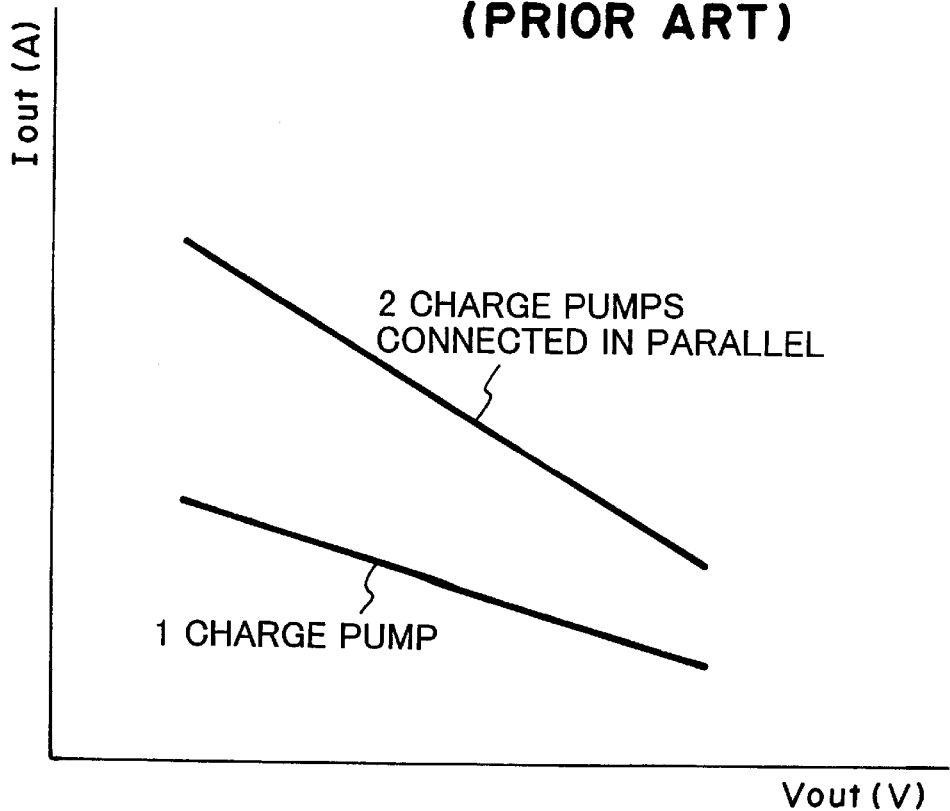
FIG. 21 is a graph showing characteristics according to a related art reference.

FIG. 1 shows the structure of a first embodiment of the present invention. The circuit structure of the first embodiment is the same as the circuit structure of the related art reference shown in FIG. 18.

In FIG. 1, booster cells comprise transfer transistors MD0 to MD3, capacitors C11 to C13, and MOS transistors D1 to D3. An input terminal, a drain, and a gate of each transfer transistor are connected. A source of each transfer transistor is an output terminal. A first terminal of each capacitor is connected to the source of each transfer transistor. A clock signal is supplied to a second terminal of each capacitor. A drain, a gate, and a power supply of each MOS transistor are connected. A source of each MOS transistor is connected to the source of each transfer transistor. A plurality of booster cells are tandem-connected. A power supply Vcc is supplied to the input terminal of the booster cell in the first stage.

Each of the transfer transistors MD0 to MD3 of the booster cells is composed of a triple-well semiconductor shown in FIG. 2. The triple-well semiconductor is composed of an N type first well 110 and a P type second well 120. The N type first well is formed on a P type semiconductor substrate 100. The P type second well 120 is formed on the N type first well 110. The semiconductor substrate 100 of each of the transfer transistors MD0 to MD3 is connected to a reference voltage. An output terminal PDn of a booster cell in the preceding stage, an N+ diffusion layer 111 in the first well 110, a P+ diffusion layer 121 in the second well 120, an N+ diffusion layer 122 in the second well 120, a first terminal of the capacitor Cl, and a gate 124 of each of the transfer transistors MD0 to MD3 are connected. The conduction type of the first well 110 is the same as the conduction type of the N+ diffusion layer 111. The conduction type of the second well 120 is the same as the conduction type of the P+ diffusion layer 121. The conduction type of the second well 120 is different from the conduction type of the N+ diffusion layer 122. The N+ diffusion layer 123 in the second well 120 is an output terminal PDn+1 of the booster cell.

Figure 3:
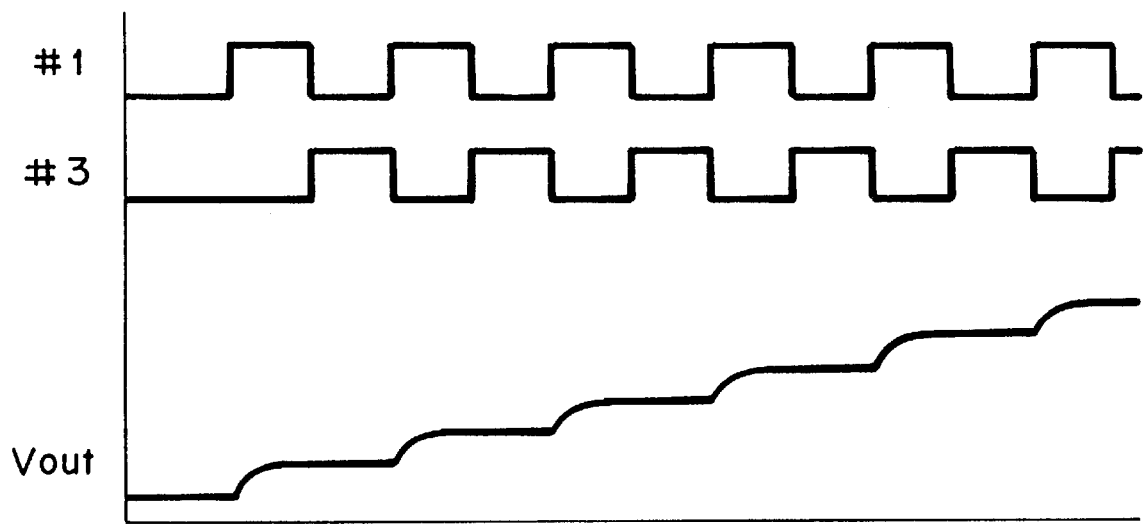
FIG. 3 is a timing chart according to the first embodiment of the present invention.

A non-inverted clock signal #1 and an inverted clock signal #3 are supplied to the capacitors C11 to C13 of the booster cells. As shown in FIG. 3, the output voltage Vout is boosted by each booster cell.

In this example, threshold values of the transfer transistors MD0, MD1, MD2, MD3, . . . and MDn are denoted by VTMD0, VTMD1, VTMD2, VTMD3, . . . , and VTMDn, respectively. Voltages (Vcc−VTD) of which a power supply voltage is dropped for the voltages corresponding to the threshold values VTD are applied to the nodes of the transfer transistors MD. The maximum voltage (Vcc−VTD+Vclk) is applied to the node PD1. The maximum voltage (Vcc−VTD+Vclk−VTM1+Vclk) is applied to the node PD2. The maximum voltage (Vcc−VTD+Vclk−VTMD1+Vclk−VTMD2−Vclk) is applied to the node PD3. The maximum voltage of the source voltage (Vout) of the final transfer transistor Mn is expressed as follows.

$$Vout = Vcc - VTD + Vclk \times n - (VTMD1 + VTMD2 + VTMD3 + \ldots + VTMDn)$$

where Vclk is a voltage applied to each node PD corresponding to a clock signal clk# supplied to each capacitor C; and n is the number of stages of transfer transistors.

In this example, the maximum voltage Vclk of the voltage amplitude applied to the drain of the transfer transistor corresponding to the clock signal is boosted as follows:

$$Vclk = (Cp/(Cp+Cj)) \times Vcc$$

where Cj is the capacitance of a diffusion layer between transistors.

After the boosting circuit operates, the voltages of the nodes P1, P2, P3, and Pn rise. However, the potential between the voltage of a sub-transfer transistor and a source of a relevant transfer transistor is at most a threshold value VTMD (for example, 0.6 V) of a pn diode. Thus, the influence of the back-gate bias characteristics is small. The source voltage (Vout) of the final transfer transistor Mn is boosted up to:

$$Vout = Vcc - VTD + Vclk \times n - VTMD \times n$$

As shown in FIG. 3, the output voltage Vout is securely boosted corresponding to the clock signals #1 and #3 proportional to the number of booster cells.

Thus, on the final output side, the current supplying capability of each transfer transistor does not deteriorate. In addition, the boosting efficiency improves and the boosting speed increases.

Figure 4:
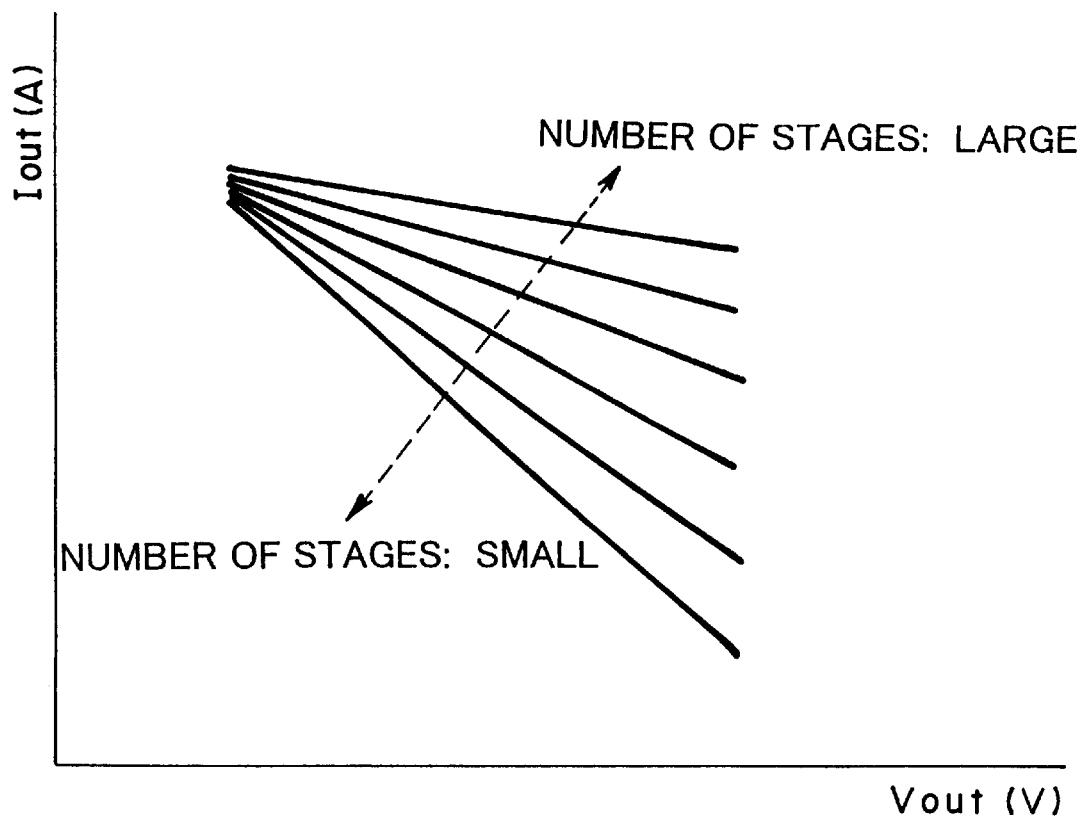
FIG. 4 is a graph showing characteristics according to the first embodiment of the present invention.

FIG. 4 is a graph showing the current supplying capability of the booster circuit. In FIG. 4, the horizontal axis represents the output voltage Vout and the vertical axis represents the output current Iout. As the number of stages of booster cells increases, the output current linearly increases. In other words, FIG. 4 shows that the power has linearity. In addition, even if the number of stages increases, the current supplying capability does not deteriorate and the boosted voltage is not limited.

Second Embodiment

Next, a second embodiment of the present invention will be described. In a four-phase clock booster circuit as shown in FIG. 5, the current supplying capability, the boosting efficiency, and the boosting speed are superior to those in the two-phase clock type booster circuit shown in FIG. 1.

Figure 5:
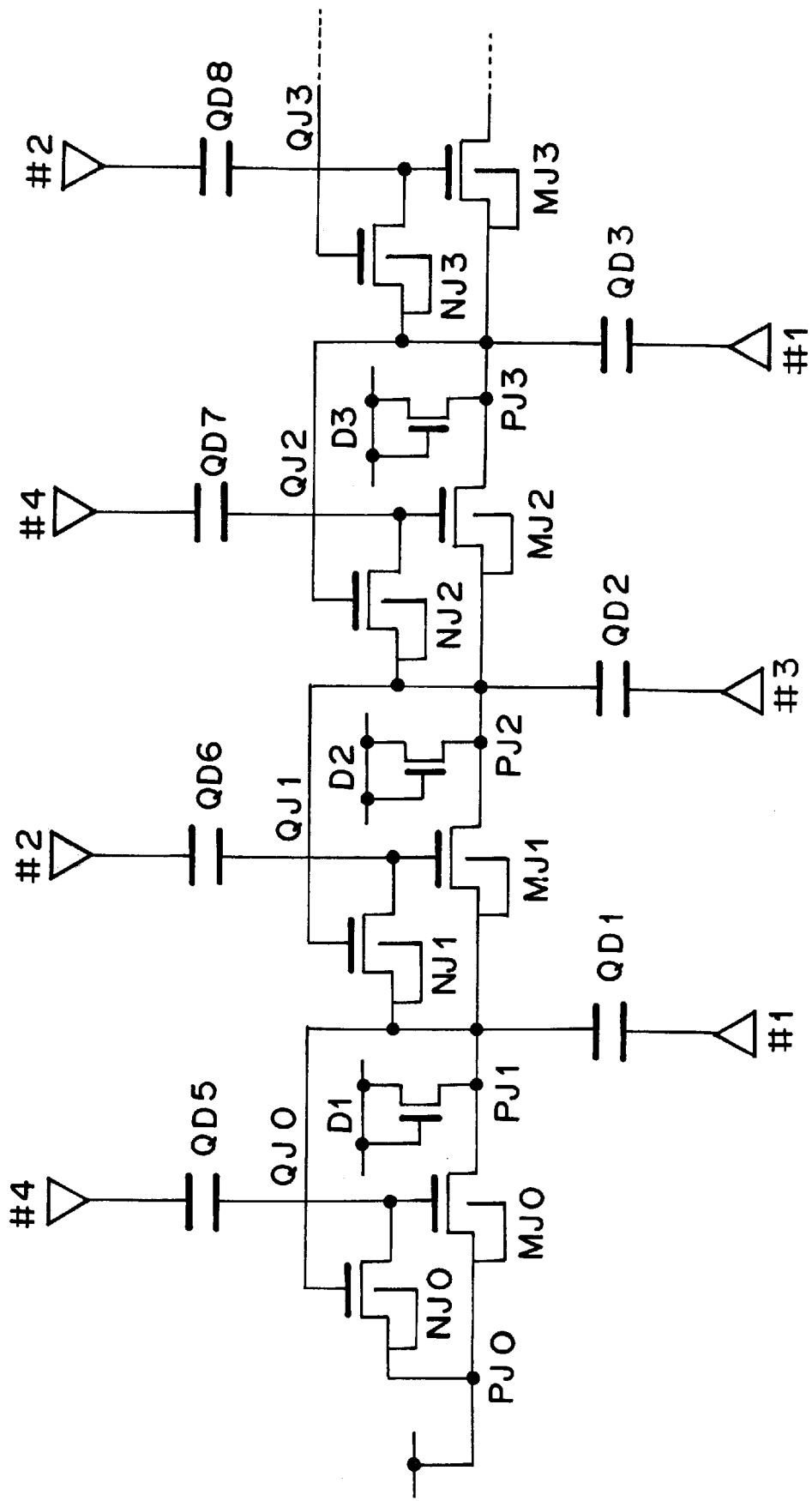
FIG. 5 is a circuit diagram according to a second embodiment of the present invention.

The circuit structure of the booster circuit shown in FIG. 5 is basically the same as that shown in FIG. 1. In other words, transfer transistors MJn and transfer transistors NJn are triple-well transistors. A drain of each of the transfer transistors MJn and the transfer transistors NJn is connected to a relevant sub-transfer transistor.

Figure 6:
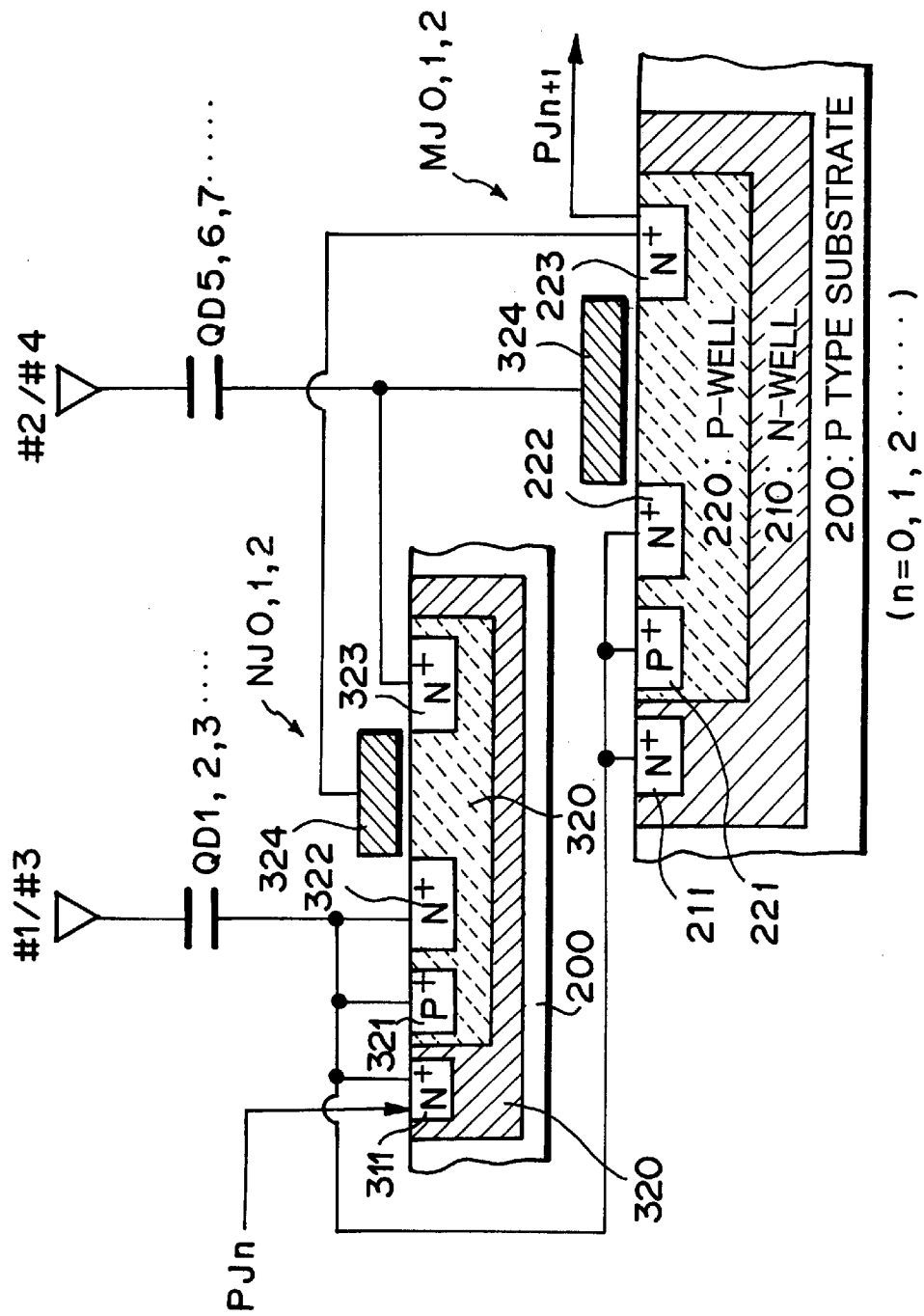
FIG. 6 is a sectional view showing a semiconductor substrate according to the second embodiment of the present invention.

FIG. 6 is a sectional view showing a real example of the structure of each booster cell shown in FIG. 5. As shown in FIG. 6, each booster cell is composed of a triple-well semiconductor device. Each transfer transistor MJn comprises an N type first well 210 and a P type second well 220. The N type first well 210 is formed on a P type semiconductor substrate 200. The P type second well 220 is formed on the N type first well 210. Each transfer transistor NJn comprises an N type first well 310 and a P type second well 320. The N type first well 310 is formed on a P type semiconductor substrate 200. The P type second well 320 is formed on the N type first well 310.

The P type semiconductor substrates 200 and 300 are connected to a reference voltage. N+ diffusion layers 211 and 311 in the first wells 210 and 310, P+ diffusion layers 221 and 321 in the second wells 220 and 320, N+ diffusion layers (drains) in the second wells 220 and 320, and first terminals of capacitors QD1 and QD2 are directly connected. The conduction type of the first wells 210 and 310 is the same as the conduction type of the N+ diffusion layers 211 and 311. The conduction type of the second wells 220 and 320 is the same as the conduction type of the P+ type diffusion layers 221 and 321. The conduction type of the second wells 220 and 320 is different from the conduction type of the N+ diffusion layers (drains) 222 and 322.

N+ diffusion layers (sources) 323 of the transfer transistors NJ0 to NJ3, gates 224 of the transfer transistors MJ0 to MJ3, and first terminals of capacitors QD5 and QD6 are directly connected. Gates 324 of the transfer transistors NJ0 to NJ3 and N+ diffusion layers (sources) 223 of the transfer transistors MJ0 to MJ3 are connected. A diffusion layer 223 of the second well 220 is an output terminal of the booster cell.

Figure 7:
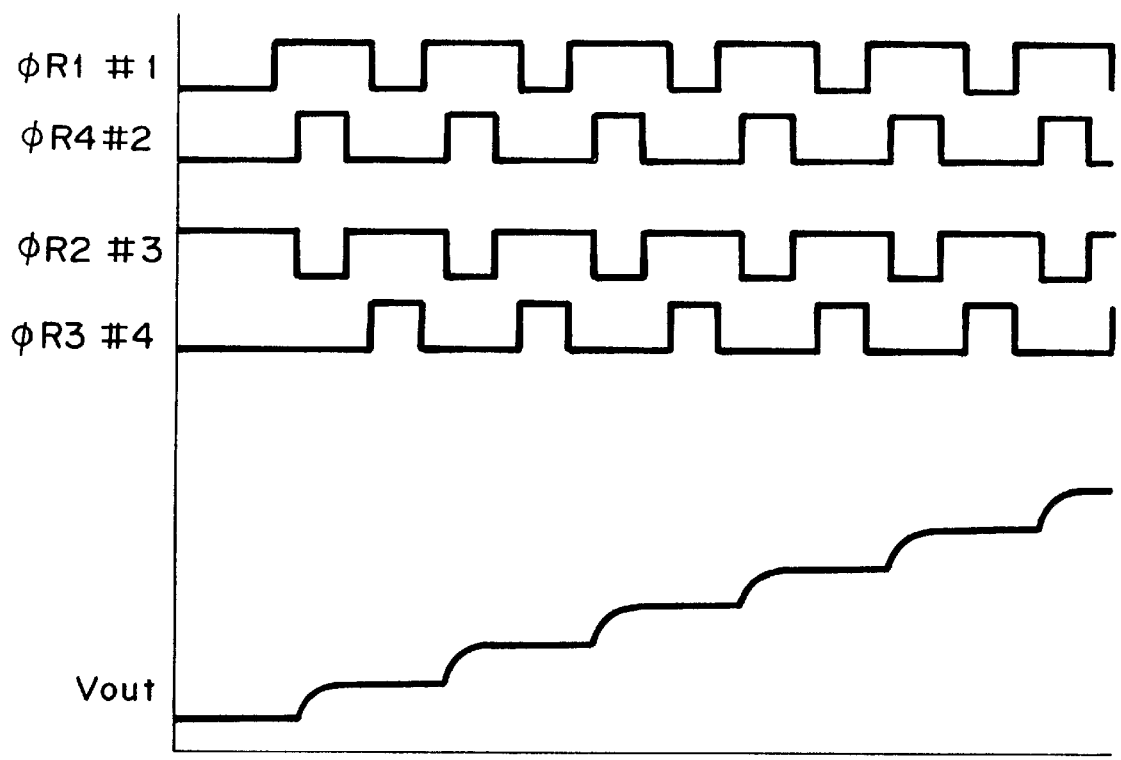
FIG. 7 is a timing chart according to the second embodiment of the present invention.

The non-inverted clock signal #1 and the inverted clock signal #3 are alternately supplied to the capacitors QD1, QD2, and QD3 of the booster cells. Likewise, the non-inverted clock signal #1 and the inverted clock signal #3 are alternately supplied to the capacitors QD1, QD2, and QD3 of the booster cells. As shown in FIG. 7, the output voltage Vout is boosted by each booster cell. The clock signals #1 to #4 are supplied at timings shown in FIG. 7. Thus, the output voltage can be effectively obtained.

With the circuit structure shown in FIG. 5 and the triple-well transfer transistors, as shown in a timing chart of FIG. 7, the output voltage Vout can be accurately boosted corresponding to the cock signals #1 to #4 free of saturation.

As described above, the booster circuit shown in FIG. 5 is a four-phase clock type booster circuit. As with the booster circuit shown in FIG. 1, each transfer transistor is formed on a triple-well. The drain of each transfer transistor is connected to a relevant sub-transfer transistor.

Third Embodiment

Figure 8:
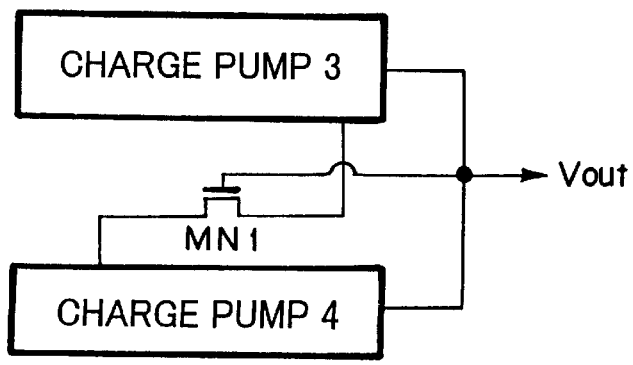
FIG. 8 is a conceptual block diagram according to a third embodiment of the present invention.

Next, with reference to FIG. 8, a third embodiment of the present invention will be described. FIG. 8 is a conceptual block diagram showing the structure according to the third embodiment of the present invention. In FIG. 8, a booster circuit comprises a charge pump 3, a charge pump 4, an MOS transistor MN1, and an output terminal. The charge pump 3 is composed of triple-well transfer transistors. Likewise, the charge pump 4 is composed of triple-well transfer transistors. A drain of the MOS transistor MN1 is connected to the last stage of the charge pump 3. A source of the MOS transistor MN1 is connected to the first stage of the charge pump 4. A gate of the MOS transistor MN1 is connected to the output terminal. Output voltages of the charge pump 3 and the charge pump 4 are obtained from the output terminal.

Conceptually, at the beginning of the boosting operation, the charge pumps 3 and 4 output boosted voltages Vout. When the voltage Vout becomes a threshold value of the MOS transistor MN1, the MOS transistor MN1 starts operating. Thus, the output voltage of the charge pump 4 gradually rises. Consequently, a highly boosted voltage can be obtained. When the MOS transistor MN1 is turned on, the charge pumps 3 and 4 are connected as if they are connected in series. Thus, a desired high voltage can be obtained.

Figure 9:
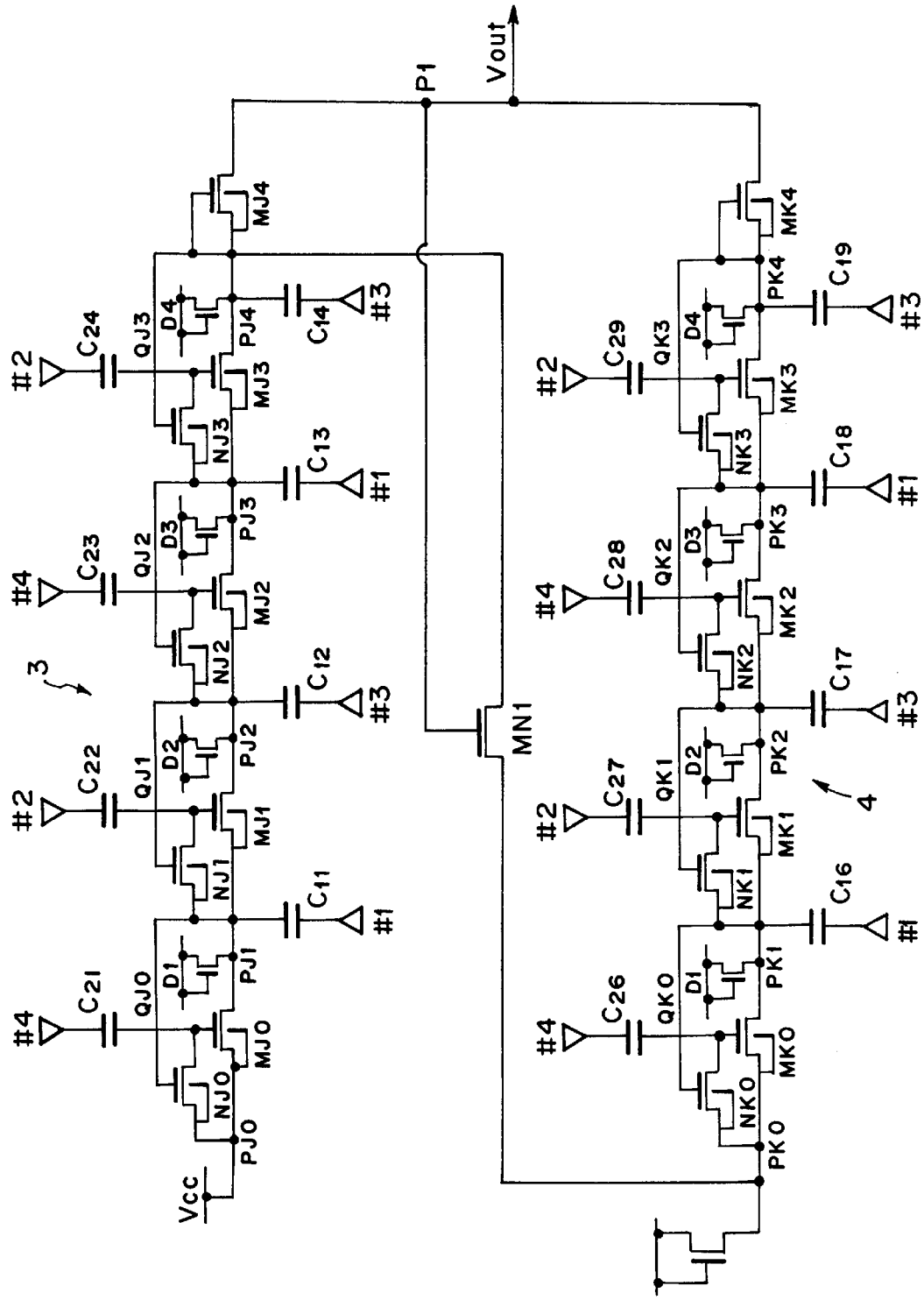
FIG. 9 is a circuit diagram according to the third embodiment of the present invention.

FIG. 9 is a circuit diagram showing the real structure of the booster circuit according to the third embodiment of the present invention. In FIG. 9, the charge pump 3 comprises a power supply Vcc, transfer transistors MJ0 to MJ3, sub-transfer transistors NJ0 to NJ3, MOS transistors D1 to D4, capacitors C11 to C14, and capacitors C21 to C24. A source of the transfer transistor MJ4 is connected to an output terminal. Likewise, the charge pump 4 comprises a power supply Vcc, transfer transistors MK0 to MK3, sub-transfer transistors NK0 to NK3, MOS transistors D1 to D4, capacitors C16 to C19, and capacitors C26 to C29. A source of the transfer transistor MK4 is connected to an output terminal P1. In this example, each of the transfer transistors MK0 to MK3 and the sub-transfer transistors NK0 to NK3 is composed of an N type transistor of which an input side drain diffusion layer, a P well, and an N well on a triple-well are connected in common. In addition, four-phase clock signals shown in FIG. 7 are supplied. Thus, a four-phase clock type booster circuit is obtained.

In addition, a drain node PJ4 of the transfer transistor MJ4 on the output side of the charger pump 3 and a drain node PK0 of the transfer transistor MK0 on the input side of the charge pump 4 are connected through the N type transistor MN1.

However, the phase of the clock signal #1 supplied to the boasting capacitor C14 connected to the node PJ4 is different from the phase of the clock signal 31 supplied to the boosting capacitor C16 connected to the source of the transfer transistor MK0 whose drain is connected to the node PK0 by 180°. A gate of the N type transistor MN1 is connected to the output terminal P1 that outputs the output voltages Vout of the charge pumps 3 and 4.

Operation of Third Embodiment

Next, the operation of the third embodiment will be described. Due to a low voltage of Vout and back-bias characteristics, at the beginning of the boosting operation, the MOS transistor MN1 is turned off. At that point, electricity for two charge pumps connected in parallel (four staged booster cells×2) is supplied as the final output voltage Vout.

In the middle of the boosting operation, since the voltage Vout at the output terminal P1 rises, the transistor MN1 is turned on. However, since the gate voltage is not sufficiently high, the charge transfer capability of the transistor MN1 is low. In other words, the charge pump 4 is in a transition state of which a parallel state is changed to a series state (eight staged booster cells×1). Thus, the current supplying capability of the booster circuit is in the middle of the current supplying capability of (four staged booster cells×2) and the current supplying capacity of (eight staged booster cells×1).

At the last of the boosting operation, the voltage Vout rises, the gate voltage of the transistor MN1 rises, and the charge transfer capability improves. Thus, the booster cells of the charge pump 4 are fully connected in series. Consequently, the charge pump 4 operates as (eight staged booster cells×1).

Figure 10:
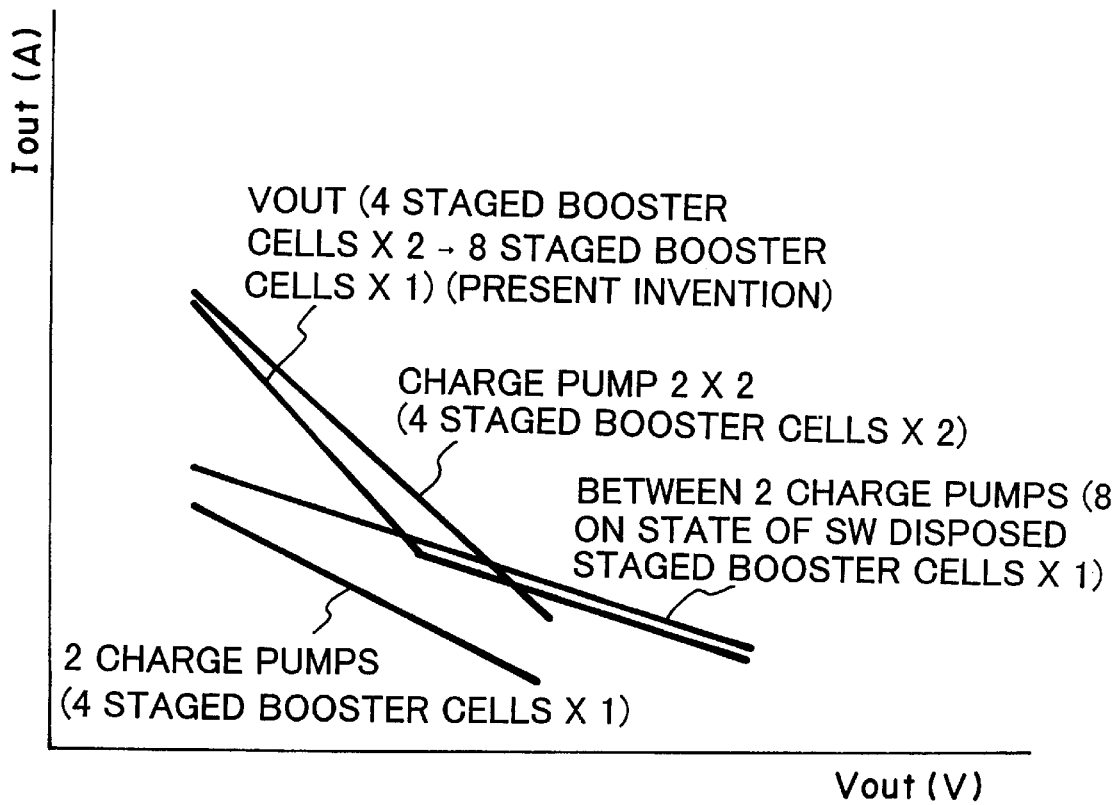
FIG. 10 is a graph showing characteristics according to the third embodiment of the present invention.

FIG. 10 is a graph showing the current supplying capability Iout at the voltage Vout. When the output voltage Vout rises from a low voltage to a middle voltage in the first half of the boosting operation, the current supplying capability is superior to the conventional current supplying capability. When the output voltage Vout rises from a middle voltage to a high voltage in the second half of the boosting operation, the current supplying capability is the same as the conventional current supplying capability. Thus, the output voltage Vout is boosted to a desired voltage.

In the first half of the boosting operation, the boosting speed can be increased. In the second half of the boosting operation, the voltage Vout can be automatically boosted to a desired voltage.

In addition, since the boosted voltage Vout is directly applied to the gate of the transistor MN1, since a controlling circuit using a switch is not required, the layout area does not remarkably increase.

Fourth Embodiment

Figure 11:
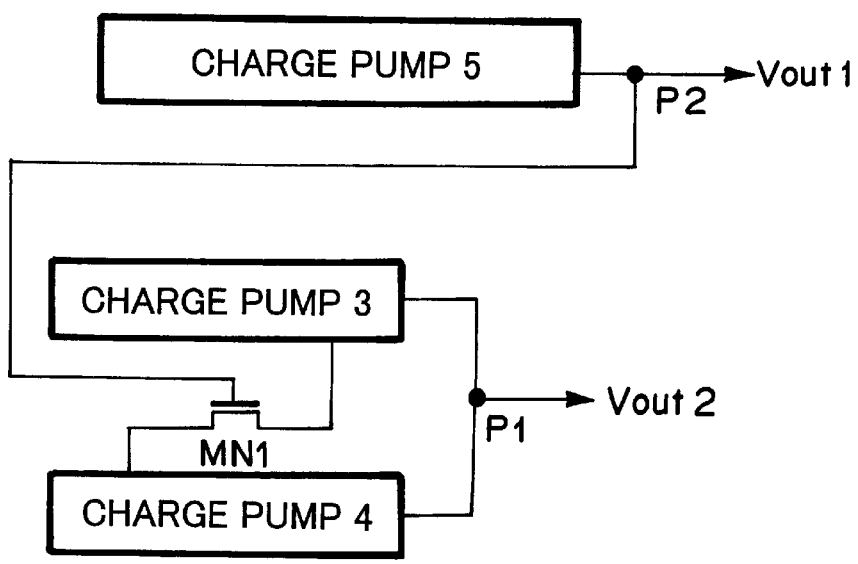
FIG. 11 is a conceptual block diagram according to a fourth embodiment of the present invention.

FIG. 11 is a conceptual block diagram showing the structure of a booster circuit according to a fourth embodiment of the present invention. In FIG. 11, the booster circuit comprises charge pumps 3, 4, and 5, an MOS transistor MN1, and an output terminal. Booster cells of the charge pumps 3, 4, and 5 are triple-well transfer transistors. A drain of the MOS transistor MN1 is connected to the last stage of the charge pump 3. A source of the MOS transistor MN1 is connected to the first stage of the charge pump 4. A gate of the MOS transistor MN1 is connected to an output terminal P2 of the charge pump 5. Output voltages Vout of the charge pumps 3 and 4 are obtained from the output terminal.

Conceptually, at the beginning of the boosting operation, the charge pumps 3 and 4 independently boost voltages and obtain output voltages Vout2. When the output voltage of the charge pump 5 becomes a threshold value of the MOS transistor MN1, the MOS transistor MN1 starts operating. Thus, the output voltage of the charge pump 4 gradually rises. Consequently, a highly boosted voltage can be obtained. When the MOS transistor MN1 is turned on, both the charge pumps 3 and 4 are connected as if they are connected in parallel. Thus, a desired high voltage can be obtained as the output voltage Vout2 from the output terminal P1. In addition, an output voltage Vout1 of the charge pump 5 can be obtained.

Figure 12:
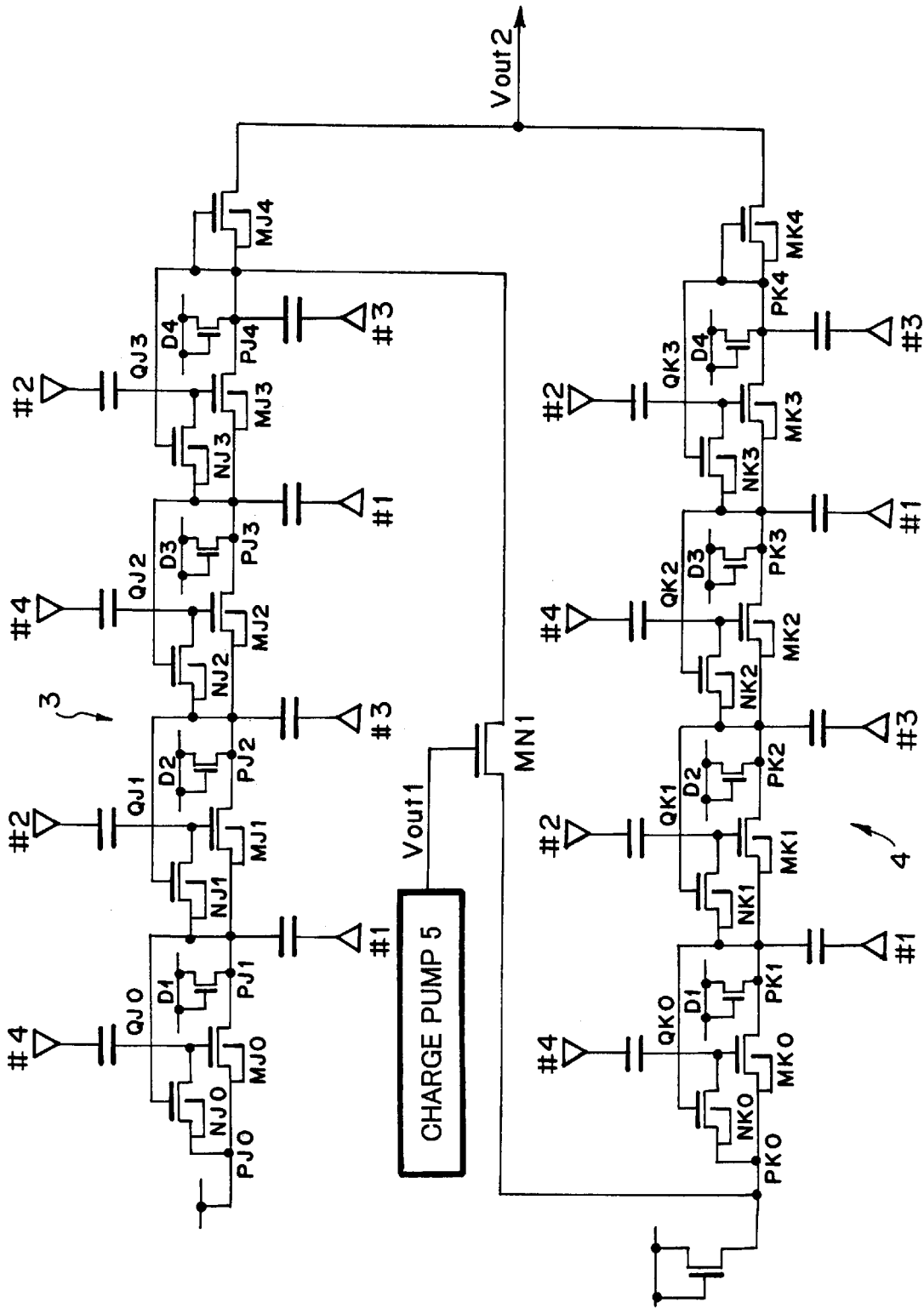
FIG. 12 is a circuit diagram according to the fourth embodiment of the present invention.

FIG. 12 is a circuit diagram showing the real structure of the booster circuit according to the third embodiment of the present invention. In FIG. 12, a charge pump 5 is illustrated as a block. In the third embodiment, as with the structure shown in FIG. 9, a four-phase clock type booster circuit is used. In the four-phase clock type booster circuit, N type transistors of which an input side drain diffusion layer, a P well, and an N well on a triple-well are connected in common are used. The structure of the booster circuit shown in FIG. 12 is different from that shown in FIG. 1 in that an output voltage (Vout1) is applied to the gate of the N type transistor (MN1) from another charge pump 5 rather than the charge pumps 3 and 4.

Operation of Fourth Embodiment

The basic operation of the fourth embodiment is the same as that of the third embodiment. For simplicity, redundant description will be omitted. In the fourth embodiment, in addition to the effects of the third embodiment, since an output voltage of the charge pump 5 is applied to the gate of the N type transistor, the transition state of the charge pump 4 from a parallel state (four staged booster cells×2) to a series state (eight staged booster×1) can be controlled. In addition, when the structure of the charge pump 5 is the same as the structure of the charge pumps 3 and 4, even if one of the charge pumps 3 and 4 gets defective, it can be easily substituted. Moreover, since two boosted voltages Vout1 and Vout2 can be obtained, the degree of freedom for controlling a semiconductor device improves.

Figure 13:
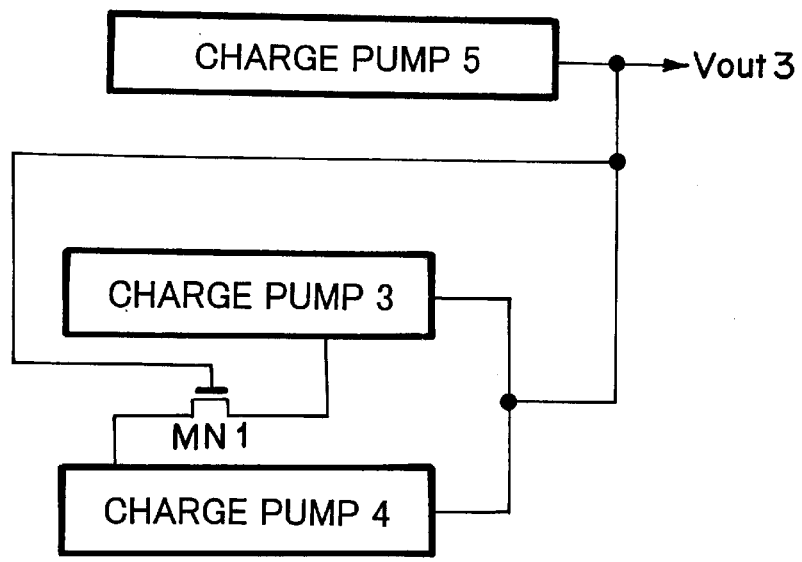
FIG. 13 is a conceptual block diagram according to the fourth embodiment of the present invention.
Figure 14:
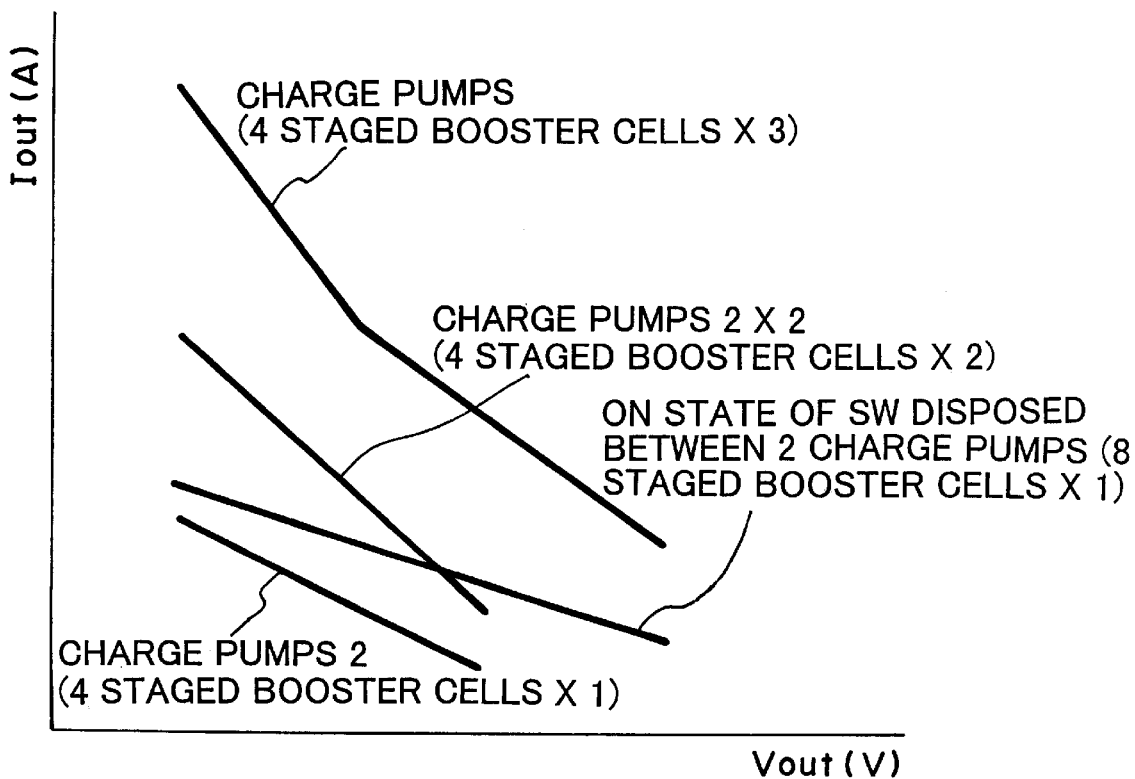
FIG. 14 is a circuit diagram according to the fourth embodiment of the present invention.
Figure 15:
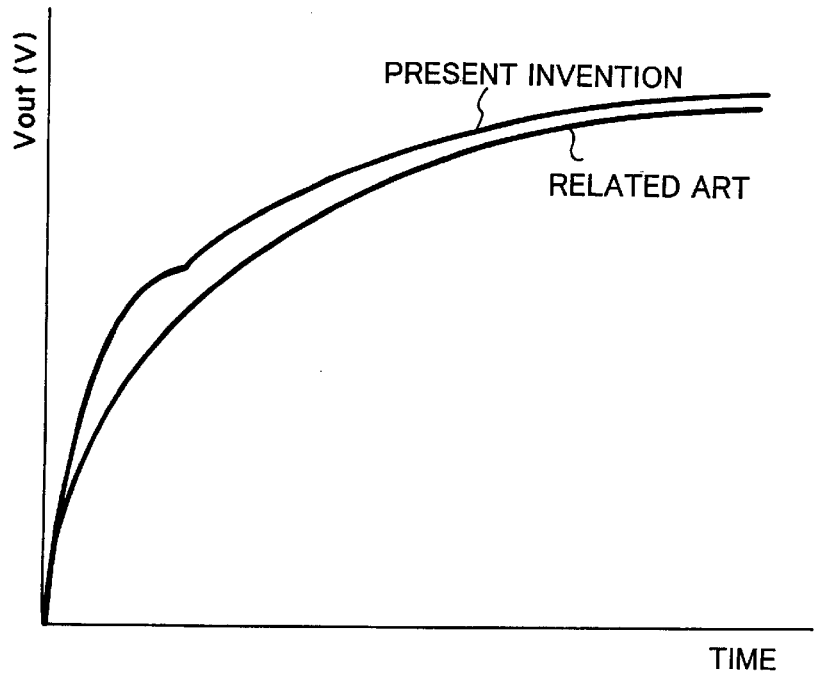
FIG. 15 is a graph showing characteristics according to the fourth embodiment of the present invention.
Figure 16:
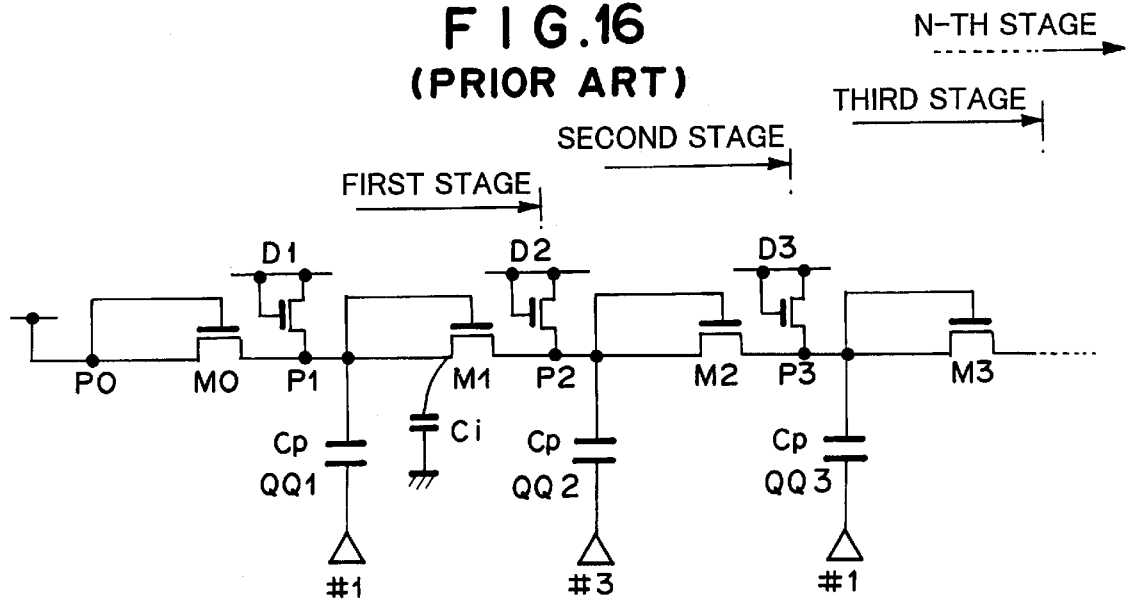
FIG. 16 is a circuit diagram according to a related art reference.
Figure 17:
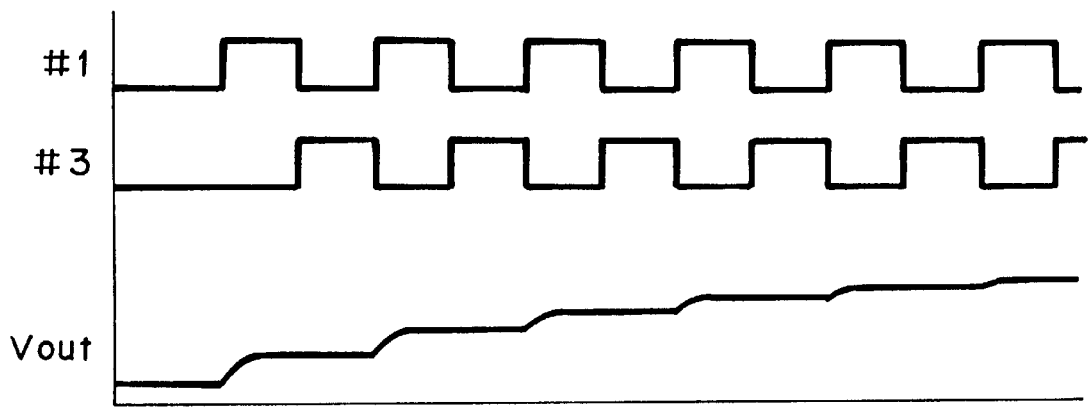
FIG. 17 is a timing chart according to a related art reference.

As a modification of the fourth embodiment, when the output voltages Vout1 and Vout2 of the charge pumps 3, 4, and 5 are connected in common, as shown in FIG. 13, the layout area is the same as that of the related art reference. However, as shown in FIG. 14, since charge pumps are connected as four staged booster cells×3, the current supplying capability is superior to that of the related art reference. Thus, as shown in FIG. 15, the boosting speed increases.

According to the present invention, since triple-well type transistors are used, a booster circuit that is less affected by back-gate bias characteristics can be obtained.

In addition, as an output voltage rises, the number of parallel booster cells and the number of serial booster cells can be automatically varied. Thus, various power supply voltages can be supplied to semiconductor circuits.

Moreover, according to the present invention, the charge supplying capability improves. In addition, the boosting speed increases.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A booster circuit having a plurality of booster cells tandem-connected, each of the boosters having a transfer transistor and a capacitor, an input terminal, a drain, and a gate of the transfer transistor being connected, a source of the transfer transistor being an output terminal, a first terminal of the capacitor being connected to the source of the transfer transistor, a clock signal being supplied to a second terminal of the capacitor, wherein the transfer transistor is composed of a triple-well having a first well and a second well, the first well being formed on a semiconductor substrate, the second well being formed on the first well, and wherein the semiconductor substrate is connected to a reference voltage, a diffusion layer in the first well, a first diffusion layer in the second well, a second diffusion layer in the second well, the first terminal of the capacitor, and the gate of the transfer transistor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well.

2. The booster circuit as set forth in claim 1, wherein clock signals with different phases by 180° are alternately supplied to the booster cells.

3. The booster circuit as set forth in claim 1,
wherein the semiconductor substrate is composed of a P type semiconductor,
wherein the first well is composed of an N type semiconductor, and
wherein the second well is composed of a P type semiconductor.

4. The booster circuit as set forth in claim 2,
wherein the semiconductor substrate is composed of a P type semiconductor,
wherein the first well is composed of an N type semiconductor, and
wherein the second well is composed of a P type semiconductor.

5. A booster circuit having a plurality of booster cells tandem-connected, each of the booster cells having a transfer transistor, a sub-transfer transistor, a first capacitor, and a second capacitor, an input terminal and a drain of the transfer transistor being connected, a source of the transfer transistor being an output terminal, the input terminal and a drain of the sub-transfer transistor being connection, a source of the sub-transfer transistor being connected to a gate of the transfer transistor and a first terminal of the second capacitor, a gate of the sub-transfer transistor being connected to a source of the transfer transistor, a first terminal of the first capacitor being connected to the source of the transfer transistor, a first clock signal being supplied to a second terminal of the first capacitor, a fourth clock signal being supplied to a second terminal of the second capacitor,
wherein the transfer transistor is composed of a triple-well having a first well and a second well, the first well being formed on a semiconductor substrate, the second well being formed on the first well, and
wherein the semiconductor substrate is connected to a reference voltage, a diffusion layer in the first well, a first diffusion layer in the second well, a second diffusion layer in the second well, and the first terminal of the capacitor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well.

6. The booster circuit as set forth in claim 5,
wherein the booster cells are driven with four-phase clock signals.

7. The booster circuit as set forth in claim 5,
wherein clock signals with different phases by 180° are alternately supplied to the booster cells.

8. The booster circuit as set forth in claim 5,
wherein the semiconductor substrate is composed of a P type semiconductor,
wherein the first well is composed of an N type semiconductor, and
wherein the second well is composed of a P type semiconductor.

9. A booster circuit having at least two charge pumps, each of the charge pumps having a plurality of booster cells tandem-connected, each of the boosters having a transfer transistor and a capacitor, an input terminal, a drain, and a gate of the transfer transistor being connected, a source of the transfer transistor being an output terminal, a first terminal of the capacitor being connected to the source of the transfer transistor, a clock signal being supplied to a second terminal of the capacitor,
wherein the transfer transistor is composed of a triple-well having a first well and a second well, the first well being formed on a semiconductor substrate, the second well being formed on the first well,
wherein the semiconductor substrate is connected to a reference voltage, a diffusion layer in the first well, a first diffusion layer in the second well, a second diffusion layer in the second well, the first terminal of the capacitor, and the gate of the transfer transistor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well, and
wherein a transistor is disposed between a first charge pump and a second charge pump, a drain of the semiconductor being connected to an output terminal of the first charge pump, a source of the transistor being connected to an input terminal of the second charge pump, a gate of the transistor being connected to the first charge pump, an output terminal of the first charge pump being connected to an output terminal of the second charge pump.

10. The booster circuit as set forth in claim 9,
wherein the booster cells are driven with four-phase clock signals.

11. The booster circuit as set forth in claim 9,
wherein clock signals with different phases by 180° are alternately supplied to the booster cells.

12. The booster circuit as set forth in claim 9,
wherein the semiconductor substrate is composed of a P type semiconductor,
wherein the first well is composed of an N type semiconductor, and
wherein the second well is composed of a P type semiconductor.

13. A booster circuit having at least two charge pumps, each of the charge pumps having a plurality of booster cells tandem-connected, each of the boosters having a transfer transistor and a capacitor, an input terminal and a drain of the transfer transistor being connected, a source of the transfer transistor being an output terminal, a first terminal of the capacitor being connected to the source of the transfer transistor, a clock signal being supplied to a second terminal of the capacitor,
wherein the transfer transistor is composed of a triple-well having a first well and a second well, the first well being formed on a semiconductor substrate, the second well being formed on the first well,
wherein the semiconductor substrate is connected to a reference voltage, a diffusion layer in the first well, a first diffusion layer in the second well, a second diffusion layer in the second well, the first terminal of the capacitor, and the gate of the transfer transistor being connected, the conduction type of the first well being the same as the conduction type of the diffusion layer in the first well, the conduction type of the second well being the same as the conduction type of the first diffusion layer in the second well, the conduction type of the second well being different from the conduction type of the second diffusion layer in the second well, and wherein a transistor is disposed between a first charge pump and a second charge pump, a drain of the semiconductor being connected to an output terminal of the first charge pump, a source of the transistor being connected to an input terminal of the second charge pump, a gate of the transistor being connected to the first charge pump, an output terminal of the first charge pump being connected to an output terminal of the second charge pump.

14. A booster circuit having at least three charge pumps, each of the charge pumps having at least one booster cell for boosting a voltage, wherein a transistor is disposed in such a manner that an output terminal of a first charge pump is connected to a drain of the transistor, an input terminal of a second charge pump is connected to a source of the transistor, an output terminal of a third charge pump is connected to a gate of the transistor, and the output terminal of the first charge pump is connected to an output terminal of the second charge pump.

15. The booster circuit as set forth in claim 14, wherein the output terminal of the first charge pump, the output terminal of the second charge pump, and the output terminal of the third charge pump are connected.

* * * * *